US012228863B2

(12) United States Patent
Tsai et al.

(10) Patent No.: US 12,228,863 B2
(45) Date of Patent: Feb. 18, 2025

(54) EUV LIGHT SOURCE CONTAMINATION MONITORING SYSTEM

(71) Applicant: TAIWAN SEMICONDUCTOR MANUFACTURING COMPANY, LTD., Hsinchu (TW)

(72) Inventors: Cheng Hung Tsai, Hsinchu (TW); Sheng-Kang Yu, Hsinchu (TW); Heng-Hsin Liu, Hsinchu (TW); Li-Jui Chen, Hsinchu (TW); Shang-Chieh Chien, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 126 days.

(21) Appl. No.: 18/133,948

(22) Filed: Apr. 12, 2023

(65) Prior Publication Data
US 2024/0345491 A1   Oct. 17, 2024

(51) Int. Cl.
*G03F 7/00*   (2006.01)

(52) U.S. Cl.
CPC ........ *G03F 7/7085* (2013.01); *G03F 7/70533* (2013.01); *G03F 7/70858* (2013.01); *G03F 7/70925* (2013.01)

(58) Field of Classification Search
CPC ............... G03F 7/7085; G03F 7/70533; G03F 7/70858; G03F 7/70925
See application file for complete search history.

(56) References Cited

U.S. PATENT DOCUMENTS

| | | | |
|---|---|---|---|
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2009/0314967 A1* | 12/2009 | Moriya | H05G 2/008 250/504 R |
| 2011/0048452 A1* | 3/2011 | Zink | B08B 7/00 134/1 |
| 2013/0319466 A1* | 12/2013 | Mizoguchi | G03F 7/70925 134/21 |

(Continued)

*Primary Examiner* — Peter B Kim
(74) *Attorney, Agent, or Firm* — STUDEBAKER & BRACKETT PC

(57) ABSTRACT

A system for monitoring and controlling an EUV light source includes a first temperature sensor, a signal processor, and a process controller. The first temperature sensor includes a portion inserted into a space surrounded by a plurality of vanes through a vane of the plurality of vanes, and obtains an ambient temperature that decreases with time as a function of tin contamination coating on the inserted portion. The signal processor determines an excess tin debris deposition on the vane based on the obtained chamber ambient temperature. The process controller activates a vane cleaning action upon being informed of the excess tin debris deposition by the signal processor, thereby improving availability of the EUV light source tool and reducing risks of tin pollution on other tools such as a reticle.

20 Claims, 10 Drawing Sheets

(56) References Cited

U.S. PATENT DOCUMENTS

2019/0146350 A1* 5/2019 Wählisch ............ G03F 7/70033
 355/67
2022/0413398 A1* 12/2022 Tsai .................... G03F 7/70033

* cited by examiner

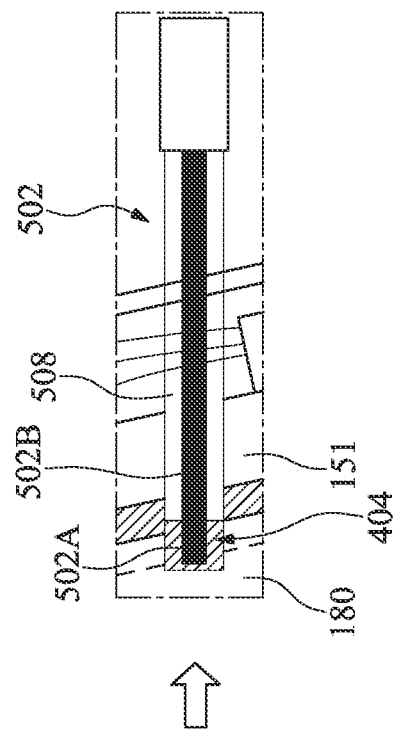
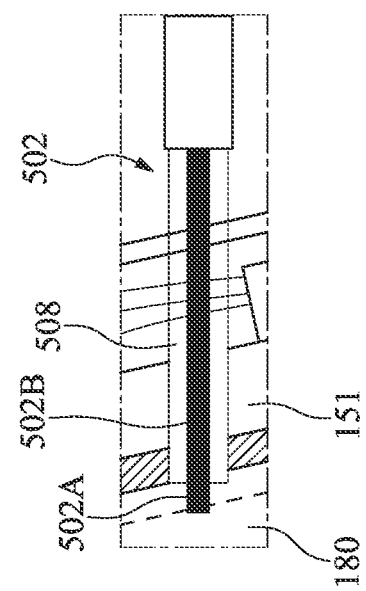
Fig. 3C
Fig. 3B

EUV LIGHT SOURCE CONTAMINATION MONITORING SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, the need to perform higher resolution lithography processes grows. One lithography technique is extreme ultraviolet lithography (EUVL). The EUVL employs scanners using light in the extreme ultraviolet (EUV) region, having a wavelength of about 1-100 nm. Some EUV scanners provide reduction projection printing, similar to some optical scanners, except that the EUV scanners use reflective rather than refractive optics, i.e., mirrors instead of lenses. One type of EUV light source is laser-produced plasma (LPP). LPP technology produces EUV light by focusing a high-power laser beam onto small tin droplet targets to form highly ionized plasma that emits EUV radiation with a peak maximum emission at 13.5 nm. The EUV light is then collected by a LPP collector and reflected by optics towards a lithography target, e.g., a wafer. Particles, ions, and tin deposition can cause pollution and degradation to the EUV light source as well as other EUV tools such as a photomask.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3B illustrates a clean resistance temperature detector (RTD) in accordance with some embodiments. FIG. 3C illustrates a contaminated RTD in accordance with some embodiments.

DETAILED DESCRIPTION

Figure 1:
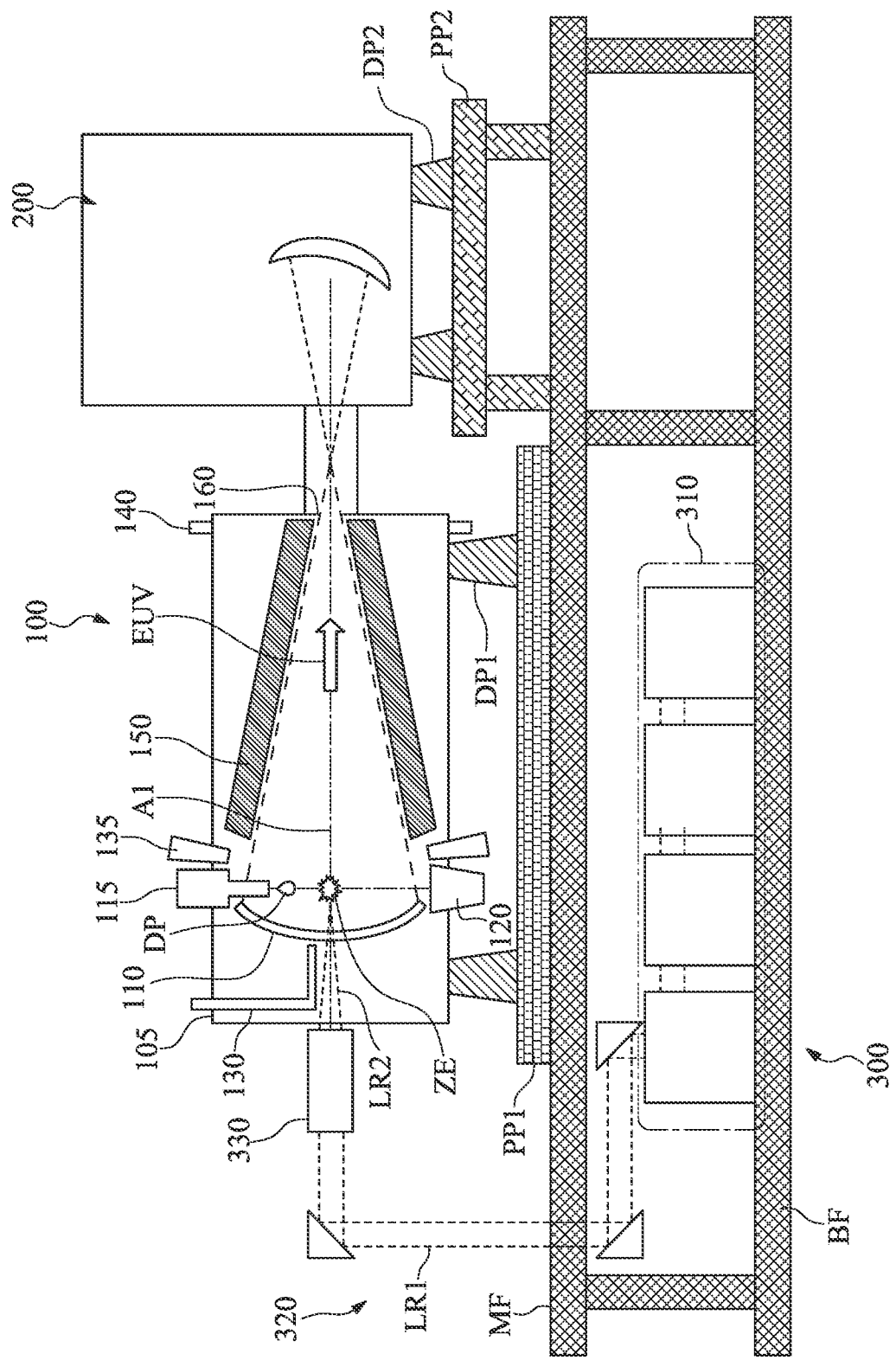
FIG. 1 is a schematic view of an EUV lithography system with a laser produced plasma (LPP) EUV radiation source apparatus in accordance with some embodiments.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity. In the accompanying drawings, some layers/features may be omitted for simplification.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of." Further, in the following fabrication process, there may be one or more additional operations in/between the described operations, and the order of operations may be changed. In the following embodiments, the term "upper" "over" and/or "above" are defined along directions with an increase in a distance from the front surface and the back surface. Materials, configurations, dimensions, processes and/or operations as explained with respect to one embodiment may be employed in the other embodiments, and the detailed description thereon may be omitted.

The present disclosure generally relates to a method and a system for monitoring an EUV light source. More particularly, the method and the system described herein facilitate inline monitoring tin (Sn) contamination in the EUV light source. In some embodiments, a system of monitoring Sn contamination in the EUV light source includes a first temperature sensor inserted into a space surrounded by a plurality of vanes through a vane to obtain a first temperature in the space, a second temperature sensor embedded in the vane to detect a second temperature in the vane, and a signal processor. The first temperature decreases as a function of tin contamination coating on an inserted portion of the first temperature sensor. The signal processor makes a comparison between the second and the first temperatures and determines an excess tin debris deposition based on a result of the comparison. In some embodiments, a process controller activates a vane cleaning action upon being informed of the excess tin debris deposition by the signal processor. The method and system described herein advantageously facilitate inline monitoring and controlling tin contamination in the EUV light source, thereby improving availability of the EUV light source tool and reducing risks of tin contamination on other tools like a reticle.

FIG. 1 is a schematic and diagrammatic view of an EUV lithography system. FIG. 3 shows a schematic view of an EUV vessel. As shown in FIG. 1, the EUV lithography system includes an EUV radiation source apparatus 100 to generate EUV light, an exposure tool 200, such as a scanner, and an excitation laser source apparatus 300. The EUV radiation source apparatus 100 and the exposure tool 200 are coupled to each other by a coupling mechanism, which may include a focusing unit.

The lithography system is an extreme ultraviolet (EUV) lithography system designed to expose a resist layer by EUV light (or EUV radiation). The resist layer is a material sensitive to the EUV light. The EUV lithography system employs the EUV radiation source apparatus 100 to generate EUV radiation or light, such as EUV light having a wavelength ranging between about 1 nm and about 100 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

The exposure tool 200 includes various reflective optic components, such as convex/concave/flat mirrors, a mask holding mechanism including a mask stage, and wafer holding mechanism. The EUV radiation EUV generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss.

In the present disclosure, the terms mask, photomask, and reticle are used interchangeably. In the present embodiment, the mask is a reflective mask. One exemplary structure of the mask includes a substrate with a suitable material, such as a low thermal expansion material or fused quartz. In various examples, the material includes $TiO_2$ doped SiO2, or other suitable materials with low thermal expansion. The mask includes multiple reflective multiple layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC). Alternatively, another reflective layer may be deposited over the ML and is patterned to define a layer of an integrated circuit, thereby forming an EUV phase shift mask.

The exposure tool 200 includes a projection optics module for imaging the pattern of the mask on to a semiconductor substrate with a resist coated thereon secured on a substrate stage of the exposure tool 200. The projection optics module generally includes reflective optics. The EUV radiation (EUV light) directed from the mask, carrying the image of the pattern defined on the mask, is collected by the projection optics module, thereby forming an image onto the resist.

In the present embodiment, the semiconductor substrate is a semiconductor wafer, such as a silicon wafer or other type of wafer to be patterned. The semiconductor substrate is coated with a resist layer sensitive to the EUV light in the present embodiment. Various components including those described above are integrated together and are operable to perform lithography exposing processes.

The lithography system may further include other modules or be integrated with (or be coupled with) other modules.

As shown in FIG. 1, the EUV radiation source 100 includes a target droplet generator 115 and a LPP collector 110, enclosed by a chamber or vessel 105. In this disclosure, the terms "chamber" and "vessel" of an EUV are used interchangeably. The target droplet generator 115 generates a plurality of target droplets DP. In some embodiments, the target droplets DP are tin (Sn) droplets. Other materials, such as Xenon (Xe), can be used. In some embodiments, Sn is doped with Ga and/or In. In some embodiments, the tin droplets each have a diameter about 30 microns (μm). In some embodiments, the tin droplets DP are generated at a rate about 50 droplets per second and are introduced into a zone of excitation (ZE) at a speed between about 70 to about 120 meters per second (m/s). Other material can also be used for the target droplets, for example, a tin containing liquid material such as a eutectic alloy containing tin or Xe.

The excitation laser LR2 generated by the excitation laser source apparatus 300 is a pulse laser. In some embodiments, the excitation layer includes a pre-heat laser and a main laser. The pre-heat laser pulse is used to heat (or pre-heat) the target droplet to create a low-density target plume, which is subsequently heated (or reheated) by the main laser pulse, generating increased emission of EUV light.

In various embodiments, the pre-heat laser pulses have a spot size about 100 μm or less, and the main laser pulses have a spot size about 200-300 μm.

The laser pulses LR2 are generated by the excitation laser source 300. The laser source 300 may include a laser generator 310, laser guide optics 320 and a focusing apparatus 330. In some embodiments, the laser source 310 includes a carbon dioxide ($CO_2$) or a neodymium-doped yttrium aluminum garnet (Nd: YAG) laser source. The laser light LR1 generated by the laser generator 300 is guided by the laser guide optics 320 and focused into the excitation laser LR2 by the focusing apparatus 330, and then introduced into the EUV radiation source 100.

The laser light LR2 is directed through windows (or lenses) into the zone of excitation ZE. The windows adopt a suitable material substantially transparent to the laser beams. The generation of the pulse lasers is synchronized with the generation of the target droplets. As the target droplets move through the excitation zone, the pre-pulses heat the target droplets and transform them into low-density target plumes. A delay between the pre-pulse and the main pulse is controlled to allow the target plume to form and to expand to an optimal size and geometry. When the main pulse heats the target plume, a high-temperature plasma is generated. The plasma emits EUV radiation EUV, which is collected by the collector mirror 110. The collector 110 further reflects and focuses the EUV radiation for the lithography exposing processes. A tin droplet catcher 120 is installed opposite the target droplet generator 115. The tin droplet catcher 120 is used for catching excessive target droplets. For example, some target droplets may be purposely missed by the laser pulses. In some embodiments, the tin droplet catcher 120 is heated at a temperature higher than the melting point of tin, e.g., about 250° C. to about 300° C.

The collector 110 is designed with a proper coating material and shape to function as a mirror for EUV collection, reflection, and focusing. In some embodiments, the collector 110 is designed to have an ellipsoidal geometry. In some embodiments, the coating material of the collector 100 is similar to the reflective multilayer of the EUV mask. In some examples, the coating material of the collector 110 includes a ML (such as a plurality of Mo/Si film pairs) and may further include a capping layer (such as Ru) coated on the ML to substantially reflect the EUV light. In some embodiments, the collector 110 may further include a grating structure designed to effectively scatter the laser beam directed onto the collector 110. For example, a silicon nitride layer is coated on the collector 110 and is patterned to have a grating pattern.

In such an EUV radiation source apparatus, the plasma caused by the laser application creates physical debris, such as ions, gases and atoms of the droplet, as well as the desired EUV radiation. It is necessary to prevent the accumulation of material on the collector 110 and also to prevent physical debris exiting the chamber 105 and entering the exposure tool 200.

As shown in FIG. 1, in the present embodiments, a buffer gas is supplied from a first buffer gas supply 130 through the aperture in collector 110 by which the pulse laser is delivered to the tin droplets. In some embodiments, the buffer gas is $H_2$, He, Ar, $N_2$ or another inert gas. In certain embodiments, $H_2$ is used as H radicals generated by ionization of the buffer gas can be used for cleaning purposes. Further, the chamber 105 includes one or more gas outlets 140 so that the buffer gas is exhausted outside the chamber 105.

Hydrogen gas has low absorption to the EUV radiation. Hydrogen gas reaching to the coating surface of the collector 110 reacts chemically with a metal of the droplet forming a hydride, e.g., metal hydride. When tin (Sn) is used as the droplet, stannane ($SnH_4$), which is a gaseous byproduct of the EUV generation process, is formed. The gaseous $SnH_4$ is then pumped out through the outlet 140. However, it is difficult to exhaust all gaseous $SnH_4$ from the chamber 105 and to prevent the $SnH_4$ from entering the exposure tool 200.

To trap the $SnH_4$ or other debris, one or more debris collection mechanisms 150 are employed in the chamber 105. As shown in FIG. 1, one or more debris collection mechanisms 150 are disposed along optical axis A1 between the zone of excitation ZE and an output port 160 of the EUV radiation source 100. The debris collection mechanism 150 serves to prevent the surface of collector 110 and/or other elements/portions of the inside the chamber 105 from being coated by Sn vapor by sweeping out slow Sn atoms and/or $SnH_4$ via vanes 151.

The vanes 151 are thin and elongate plates. In some embodiments, each of the vanes has a triangular or trapezoid or trapezium shape in plan view. The vanes 151 are aligned so that their longitudinal axes are parallel to the optical axis A1 so that they present the smallest possible cross-sectional area to the EUV radiation EUV. The vanes 151 are heated at 100° C. to 400° C. by a heater in some embodiments.

Figure 2:
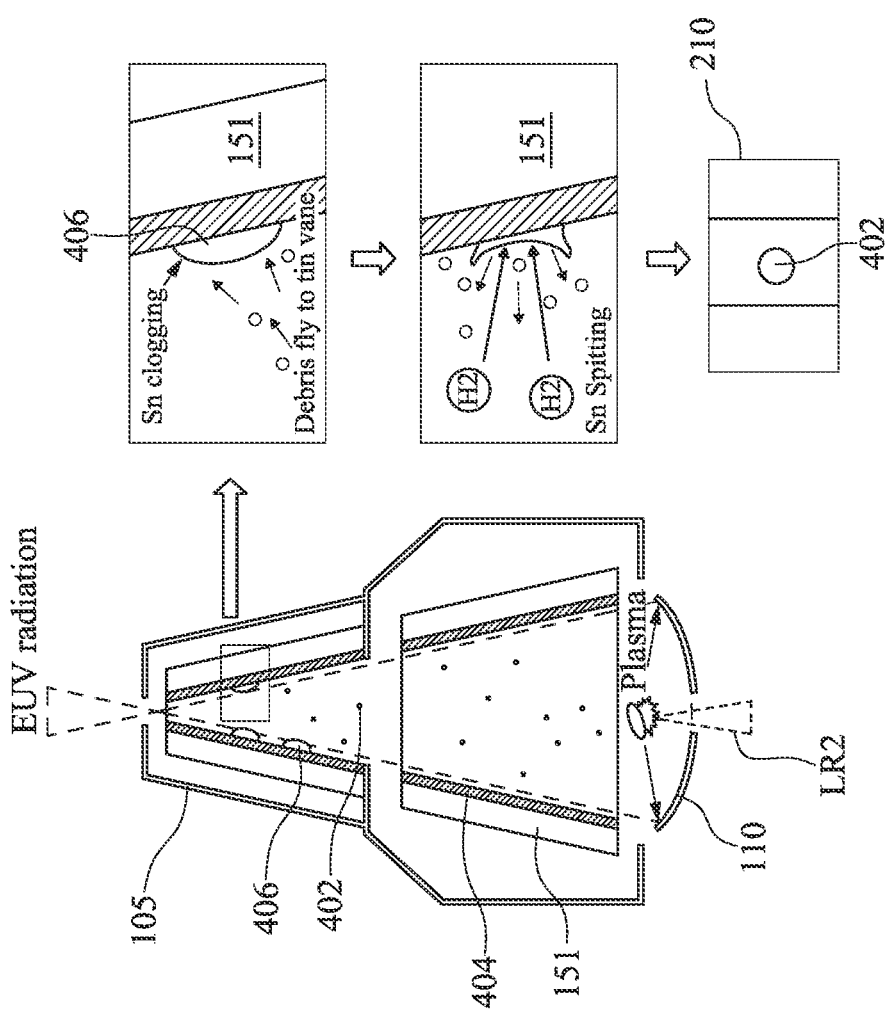
FIG. 2 is a schematic view showing impact of tin (Sn) debris generated in the EUV radiation source.

FIG. 2 is a schematic view showing impact of tin (Sn) debris 402 produced in the laser-produced plasma (LPP) process in the EUV radiation source on a reticle or a photomask 210 in the exposure tool 200. Sn debris 402 escaped from the EUV radiation source and falling on the reticle 210 can cause pollution on the reticle 210 thereby leading to expensive reticle repairs. A source of Sn debris 402 towards the reticle 210 is from the laser-produced plasma (LPP) process in the EUV radiation source as shown in FIG. 1. In addition, as shown in FIG. 2, Sn debris 402 generated in the LPP process accumulates on surfaces of the vanes 151 of the EUV light source, forms Sn coating 404, and then forms Sn clogging (or excess Sn debris deposition) 406 on the surfaces of the vanes 151. The excess Sn debris deposition 406 becomes another source of Sn debris 402 towards the reticle 210. Periodically inspecting and stopping the EUV tools to remove the excess Sn debris deposition 406 in the EUV radiation source may cause an impact on the EUV tool availability (e.g., causing availability reduction by about 10% per month).

Figure 3A:
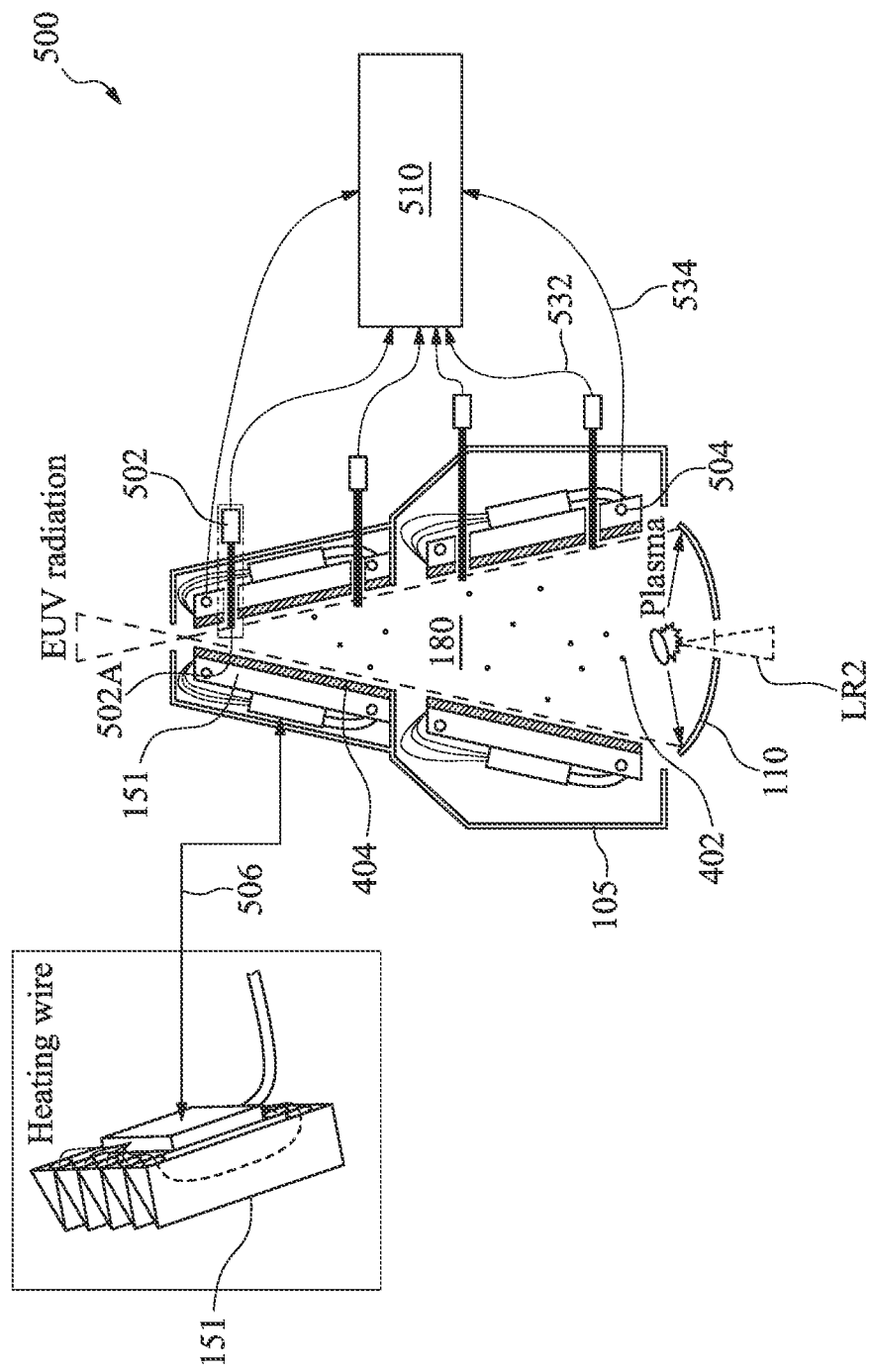
FIG. 3A is a schematic view of a system for monitoring an EUV radiation source in accordance with some embodiments.

FIG. 3A is a schematic view of a system 500 for monitoring an EUV radiation source in accordance with some embodiments. The system 500 for monitoring tin contamination in the EUV light source includes one or more first temperature sensors 502, one or more second temperature sensors 504, and a signal processor 510 coupled to the first and second temperature sensors. In some embodiments, the system 500 includes one or more heaters 506 that are attached to one or more vanes 151 and are configured to heat up the vane 151 to a heated up temperature (e.g., 350° C.) to remove the excess tin debris deposition 406 (see FIG. 2) formed on the vane 151.

In some embodiments, a first temperature sensor 502 is inserted through a vane 151 of the plurality of vanes 151 into a space 180 that is surrounded by a plurality of vanes 151. The first temperature sensor 502 obtains a first temperature or an ambient temperature 532 in the space 180. In some embodiments, a second temperature sensors 504 is embedded in a vane 151 to obtain a vane temperature 534 that can be used as a reference temperature.

In some embodiments, the first temperature sensor 502 is a resistance temperature detector (RTD), a thermocouple sensor, or an infrared thermometer. In some embodiments, the second temperature sensor 504 is a resistance temperature detector or a thermocouple sensor.

FIG. 3B illustrates a clean resistance temperature detector (RTD) 502 without contamination Sn coating 404 on an inserted portion 502A, and FIG. 3C illustrates a contaminated RTD 502 with contamination Sn coating 404 on the inserted portion 502A in accordance with some embodiments. In FIG. 3B, the surface of the inserted portion 502A of the RTD 502 is clean without contamination Sn coating 404. In FIG. 3C, Sn coating 404 generated in the LPP process accumulates on the surface of the inserted portion 502A of the RTD 502.

Figure 3D:
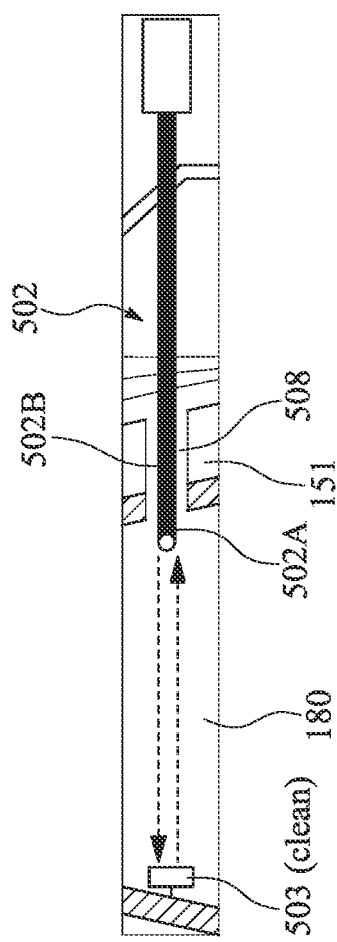
FIG. 3D illustrates a clean infrared thermometer in accordance with some embodiments.
Figure 3E:
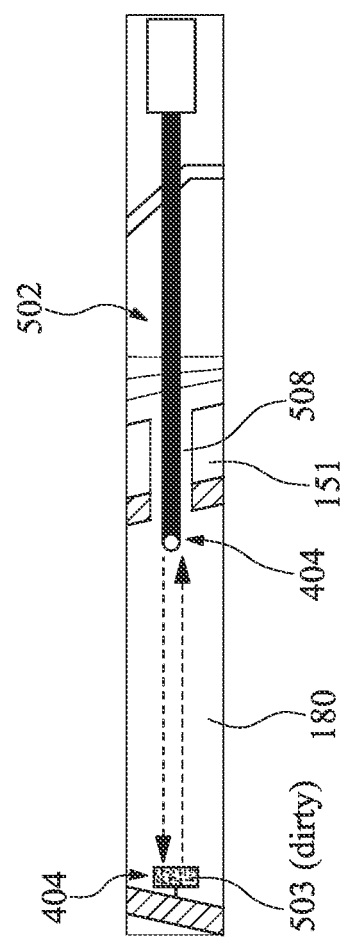
FIG. 3E illustrates a contaminated infrared thermometer in accordance with some embodiments.

FIG. 3D illustrates a clean infrared thermometer 502 and FIG. 3E illustrates a contaminated infrared thermometer 502 in accordance with some embodiments. The infrared thermometer 502 includes a reflector 503 that is positioned in the space 180 and reflects light coming from the inserted portion 502A back to the inserted portion 502A. In FIG. 3D, the surfaces of the reflector 503 and the inserted portion 502A of the infrared thermometer 502 are clean without contamination Sn coating 404. In FIG. 3E, Sn coating 404 generated in the LPP process accumulates on the surfaces of the reflector 503 and the inserted portion 502A of the infrared thermometer 502.

As shown in FIGS. 3B, 3C, 3D and 3E, the first temperature sensor 502 includes a heat insulator 508 that insulates other portions 502B than the inserted portion 502A of the first temperature sensor 502 from the space 180 and the vane 151, in some embodiments. In some embodiments, the heat insulator 508 is made of ceramic material. The first temperature sensor 502 uses the inserted portion 502A for detecting or reading an ambient temperature inside the space 180.

Figure 3F:
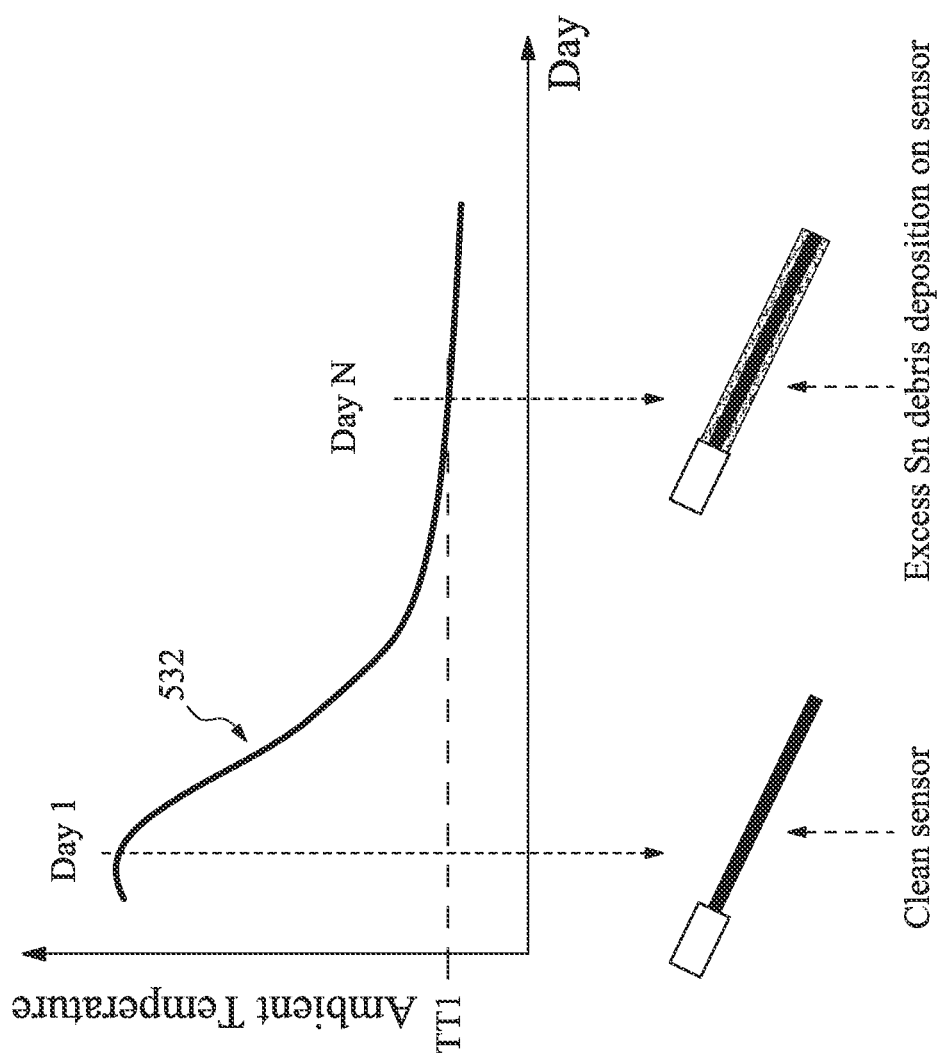
FIG. 3F illustrates variations of an ambient temperature with time detected by a temperature detector in accordance with some embodiments.

FIG. 3F illustrates variations of the ambient temperature or the first temperature 532 detected by the first temperature sensor 502 with time in accordance with some embodiments. The first temperature sensor 502 obtains the first temperature 532 in the space 180 through the inserted portion 502A of the first temperature sensor 502. Sn debris 402 generated in the LPP process accumulates and thus forms contamination Sn coating 404 on the surfaces of the vanes 151 and the inserted portion 502A of the first temperature sensor 502. The contamination Sn coating 404 accumulated on the surface of the inserted portion 502A of the first temperature sensor 502 affects the first temperature 532 detected by the first temperature sensor 502, which decreases as a function of the contamination Sn coating 404 on the inserted portion 502A.

In some embodiments, the signal processor 510 determines an occurrence of excess tin debris deposition 406 on the vane 151 upon observing the ambient temperature 532 equal to or lower than a first threshold value TT1 (e.g., 180° C.). In some embodiments, the first threshold value TT1 is in a range from about 175° C. to about 185° C. The first threshold value TT1 is saved in a storage or a database in the signal processor 510 in some embodiments, and the first threshold value TT1 is saved in a storage or a database outside the signal processor 510 in other embodiments.

Figure 3G:
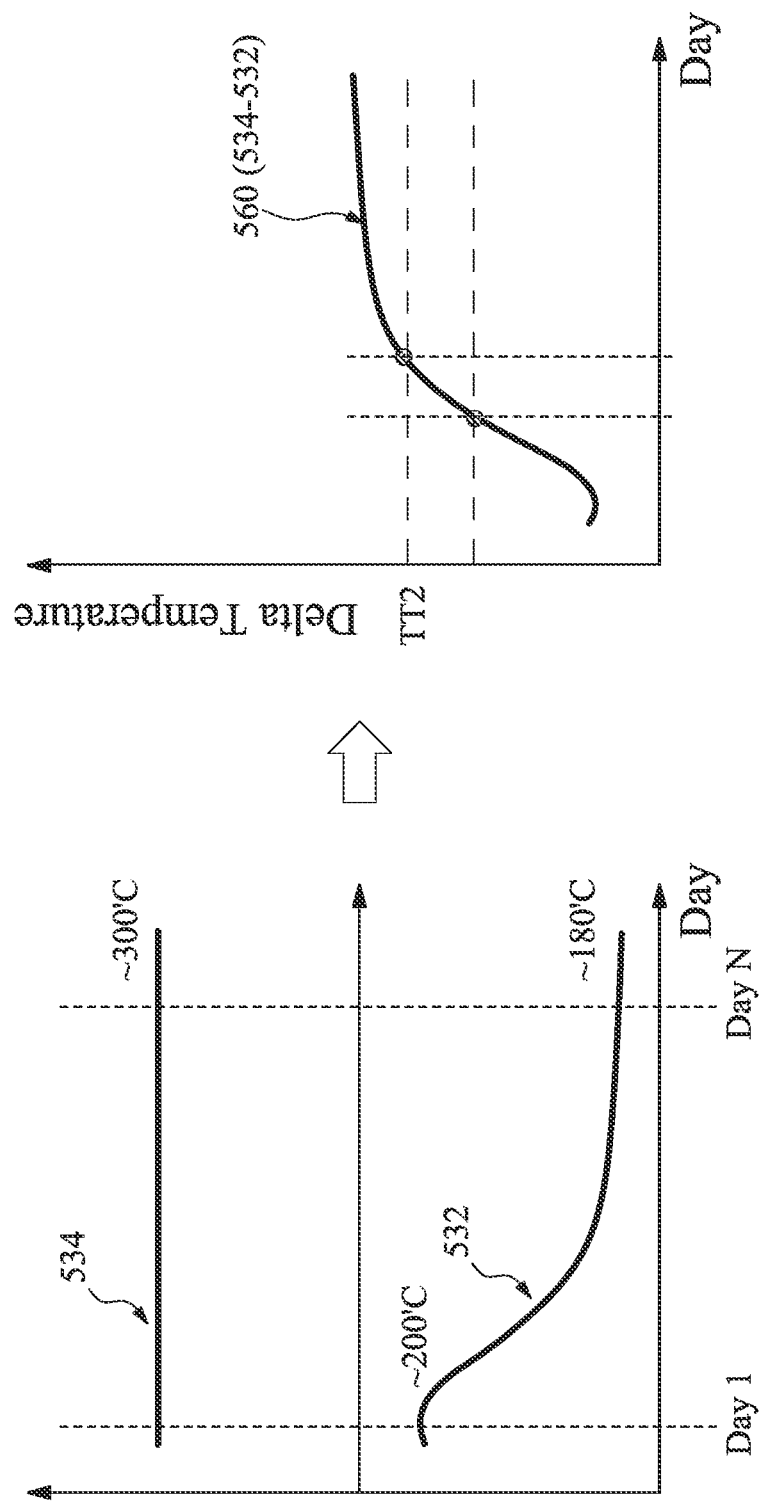
FIG. 3G illustrates variations of a difference between a vane temperature and an ambient temperature with time detected by temperature detectors in accordance with some embodiments.

FIG. 3G illustrates variations of a difference 560 between a vane temperature 534 detected by the second temperature sensor 504 and an ambient temperature 532 detected by a first temperature detector 502 with time in accordance with some embodiments. In some embodiments, the signal processor 510 makes a comparison between the second temperature 534 and the first temperature 532, and determines an occurrence of excess tin debris deposition 406 based on a result of the comparison.

As shown in FIG. 3G, the vane temperature 534 detected by the second temperature sensor 504 remain constant, for example, at 300° C. Due to the contamination Sn coating 404 accumulated on the inserted portion 502A of the first temperature sensor 502, the first temperature 532 detected by the first temperature sensor 502 decreases as a function of contamination Sn coating on the inserted portion 502A of the first temperature sensor 502. Therefore, a difference 560 between the vane temperature 534 detected by the second temperature sensor 504 and the ambient temperature 532 detected by the first temperature detector 502 increases with time.

In some embodiments, the signal processor 510 determines an occurrence of excess tin debris deposition 406 on the vane 151 upon observing the difference 560 between the vane temperature 534 detected by the second temperature sensor 504 and the ambient temperature 532 detected by the first temperature detector 502 equal to or greater than a second threshold value TT2 (e.g., 120° C.). In some embodiments, the second threshold value TT2 is in a range from about 115° C. to about 125° C. The second threshold value TT2 is saved in a database or a storage in the signal processor 510 in some embodiments, and the second threshold value TT2 is saved in a database or a storage outside the signal processor 510 in other embodiments.

In some embodiments, the signal processor 510 determines an occurrence of excess tin debris deposition 406 on the vane 151 upon observing a changing rate of the difference 560 between the vane temperature 534 detected by the second temperature sensor 504 and the ambient temperature 532 detected by the first temperature detector 502 with time is equal to or less than a threshold temperature changing rate (e.g., 0.2° C./running day or 0.0083° C./running hour). In some embodiments, the threshold temperature changing rate is in a range from about 0.0080° C./running hour to about 0.0086° C./running hour.

Figure 4:
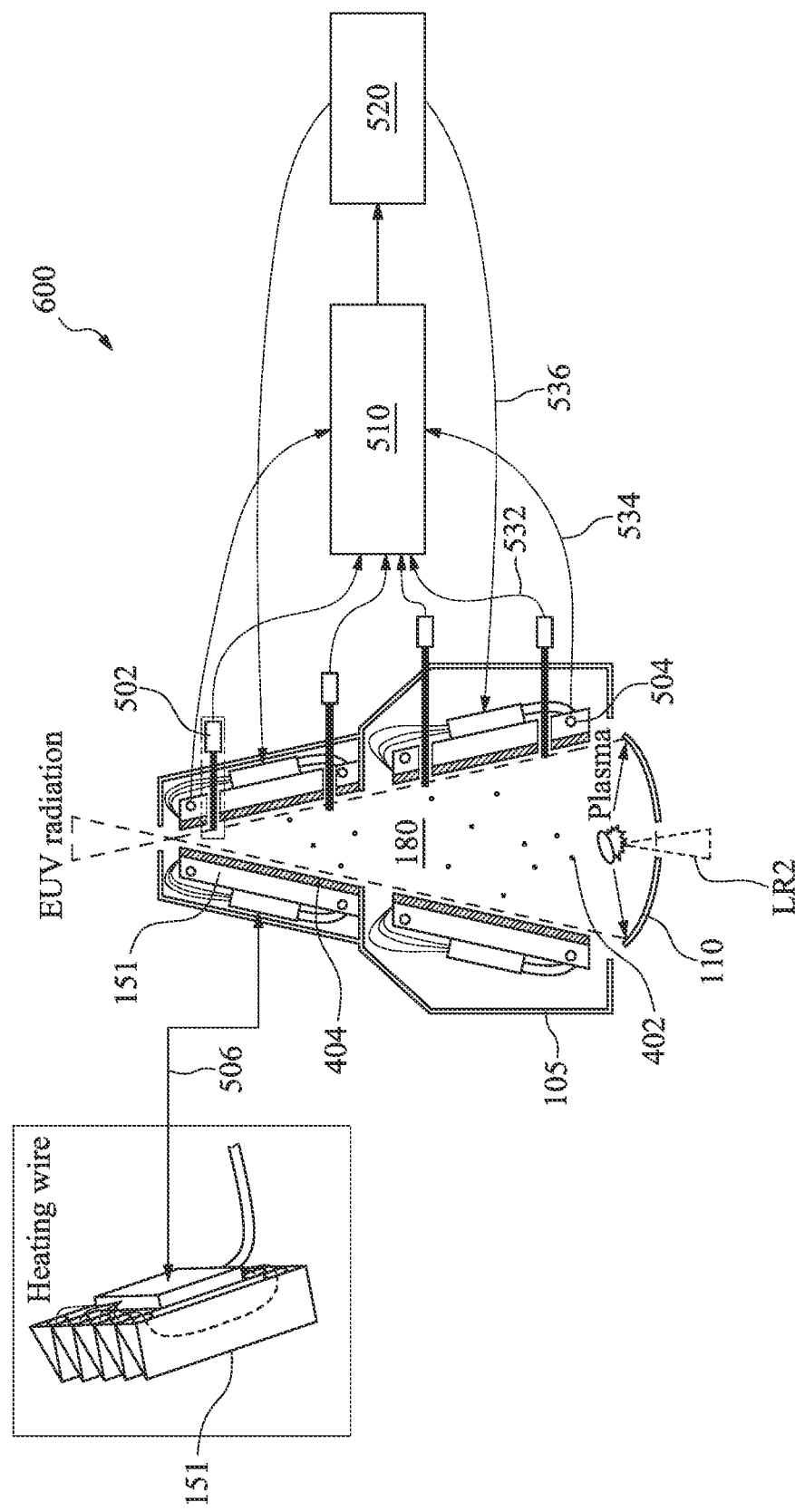
FIG. 4 is a schematic view of a system for monitoring and controlling an EUV radiation source in accordance with some embodiments.

In some embodiments, the signal processor 510 informs a process controller 520 (as shown in FIG. 4) of the occurrence of the excess tin debris deposition 406 upon determining the excess tin debris deposition 406.

FIG. 4 is a schematic view of a system 600 for monitoring and controlling an EUV radiation source 105 in accordance with an embodiment.

In some embodiments, the system 600 includes one or more first temperature sensors 502, one or more second temperature sensors 504, a signal processor 510, and a process controller 520. In some embodiments, the system 600 includes one or more heaters 506 that are attached to one or more vanes 151 and are configured to heat up the vanes 151 to a heated up temperature (e.g., 350° C.) to remove the excess tin debris deposition 406 (see FIG. 2) formed on the vanes 151.

In some embodiments, a first temperature sensor 502 includes a portion 502A inserted through a vane 151 of a plurality of vanes 151 into a space 180 surrounded by the plurality of vanes 151, and obtains an ambient temperature 532 in the space 180. The ambient temperature 532 decreases with time as a function of accumulated contamination Sn coating 404 on the inserted portion 502A.

In some embodiments, a second temperature sensor 504 is embedded in the vane 151 and obtains a vane temperature 534. The vane temperature 534 remain constant with time.

In some embodiments, the signal processor 510 determines an occurrence of excess tin debris deposition 406 on the vane 151 based on the obtained chamber ambient temperature 532. In other embodiments, the signal processor 510 determines an occurrence of excess tin debris deposition 406 on the vane 151 based on a difference 560 between the vane temperature 534 and the ambient temperature 532.

In some embodiments, the signal processor 510 informs a process controller 520 of the occurrence of excess tin debris deposition 406 on the vane 151 upon determining the occurrence of excess tin debris deposition 406.

In some embodiments, the process controller 520 sends out an activation signal 536 to activates a vane cleaning action upon being informed of the occurrence of excess tin debris deposition 406 by the signal processor 510.

In some embodiments, the ambient in the vessel 105 includes hydrogen gas ($H_2$), and a vane cleaning action includes heating up a vane 151, which is identified to have an excess tin debris deposition 406 accumulated thereon, to a heated-up temperature (e.g., 350° C.), thereby causing the hydrogen gas ($H_2$) to react with the excess tin debris deposition 406 and thus removing the excess tin debris deposition 406 from the vane 151. In some embodiments, the heated-up temperature is in a range from about 345° C. to about 355° C.

In some embodiments, the signal processor 510 and the process controller 520 are integrated as one controller or processor.

Figure 5:
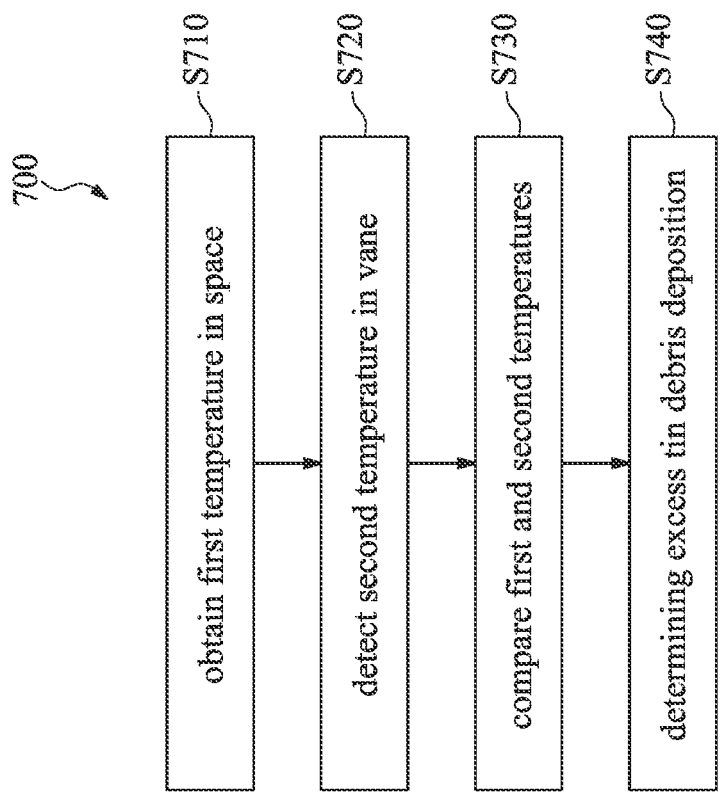
FIG. 5 is a flowchart showing a method of monitoring an EUV radiation source in accordance with some embodiments.

FIG. 5 is a flowchart showing a method 700 of monitoring an EUV radiation source by using a contamination monitoring system 500 as shown in FIG. 3A in accordance with some embodiments. It is understood that additional operations can be provided before, during, and after processes discussed in FIG. 5, and some of the operations described below can be replaced or eliminated, for additional embodiments of the method. The order of the operations/processes may be interchangeable and at least some of the operations/processes may be performed in a different sequence. In some embodiments of the present disclosure, at least two or more operations/processes are performed overlapping in time, or almost simultaneously.

In some embodiments of the present disclosure, as shown in FIG. 3A, the contamination monitoring system 500 used in the method 700 includes a set of first temperature sensors 502, a set of second temperature sensors 504, and a signal processor 510.

In some embodiments of the present disclosure, the method 700 of monitoring an EUV light source includes an operation S710 of obtaining a first temperature 532 in a space 180 that is surrounded by a plurality of vanes 151 by using a first temperature sensor 502.

In some embodiments, a portion 502A of the first temperature sensor 502 is inserted into the space 180 through a vane 151 of the plurality of vanes. The first temperature sensor 502 includes a heat insulator 508 that insulates the other portion 502B of the first temperature sensor 502 than the inserted portion 502A from the space 180 and the vane 151. Sn debris 402 generated in the LPP process accumulates and thus forms Sn coating 404 on a surface of the inserted portion 502A of the first temperature sensor 502. Due to the contamination Sn coating 404 accumulated on the inserted portion 502A of the first temperature sensor 502, the first temperature 532 detected by the first temperature sensor 502 decreases as a function of contamination Sn coating 404 on the inserted portion 502A of the first temperature sensor 502.

In operation S720, a second temperature 534 in the vane 151 is detected by using a second temperature sensor 504. The second temperature sensor 504 is embedded in the vane 151 and is adjacent the first temperature sensor 502. The second temperature 534 generally is constant with time and thus can be used as a reference temperature value in the vessel 105.

In operation S730, the first temperature 532 and the second temperatures 534 are compared by using a signal processor 510 to obtain a comparison result. In some embodiments, a difference 560 between the second temperature 534 and the first temperature 532 is obtained as the comparison result.

In operation S740, an occurrence of excess tin debris deposition 406 is determined by the signal processor 510 based on the comparison result.

In some embodiments, the signal processor 510 determines the occurrence of excess tin debris deposition 406 upon detecting the difference 560 between the second temperature 534 and the first temperature 532 equal to or greater than a threshold temperature value TT2 (e.g., 120° C.).

In some embodiments, the signal processor 510 determines the occurrence of the excess tin debris deposition 406 upon detecting a changing rate of a difference 560 between the second temperature 534 and the first temperature 532 with time equal to or less than a threshold changing rate (e.g., about 0.2° C./running day or 0.0083° C./running hour).

In some embodiments, the signal processor 510 informs a process controller 520 of the occurrence of excess tin debris deposition 406 upon determining the occurrence of excess tin debris deposition 406.

In some embodiments, the process controller 520 activates a cleaning action upon being informed of the occurrence of excess tin debris deposition 406 by the signal processor 510.

In some embodiments, the cleaning action includes heating up a heater 506 attached to the vane 151 to a heated-up temperature (e.g., 350° C.) to cause a reaction between the hydrogen gas ($H_2$) existing in the vessel 105 and the excess tin debris deposition 406 formed on the vane 151 to produce a gaseous $SnH_4$. The gaseous $SnH_4$ is then pumped out through an outlet 140 of the vessel 105, thereby removing the excess tin debris deposition 406 from the vane 151 of the vessel 105. In some embodiments, a heater 506 is shared and attached a group of vanes 151 (e.g., 6 vanes), and is capable of heating up the group of vanes 151 upon receiving an activation signal from the process controller 520.

In some embodiments, upon being informed of the occurrence of excess tin debris deposition 406 by the signal processor 510, the process controller 520 stops the operation of the EUV radiation source and activates a cleaning action on the vanes 151 by heating up the heaters 506 attached to the vanes 151 to remove the excess tin debris deposition 406. Additionally, before the start of next operation cycle of the EUV radiation source, the current first temperature sensors 502 are cleaned by removing the contamination Sn coating thereon, or are replaced with new ones in case that the current first temperature sensors are uncleanable or irrecoverable.

Figure 6B:
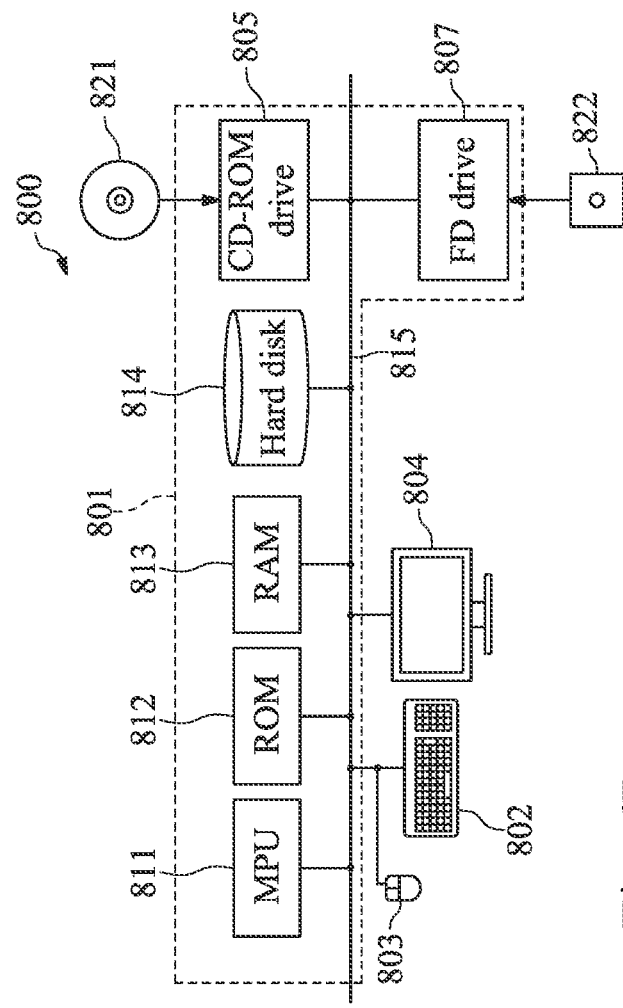
FIGS. 6A and 6B show an embodiment of a process controller in accordance with some embodiments.
Figure 6A:
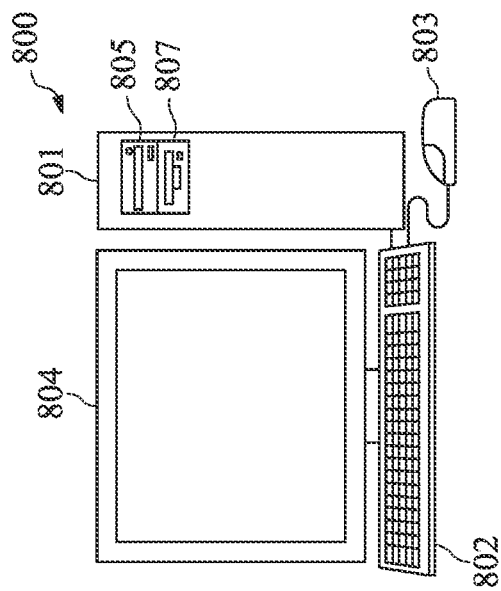

FIGS. 6A and 6B show an embodiment of a controller in accordance with some embodiments. All of or a part of the methods or operations of the foregoing embodiments are realized using computer hardware and special purpose computer programs executed thereon.

In FIG. 6A, an embodiment of the controller 800 is illustrated. The controller 800 is a computer system 800 provided with a computer 801 including an optical disk read only memory (e.g., CD-ROM or DVD-ROM) drive 805 and a magnetic disk drive 807, a keyboard 802, a mouse 803, and a monitor 804 in some embodiments. At least one of the signal processor 510 or the process controller 520 is realized by the controller or the computer system 800.

FIG. 6B is a diagram showing an internal configuration of the computer system 800 in some embodiments. In FIG. 6B, the computer 801 is provided with, in addition to the optical disk drive 805 and the magnetic disk drive 807, one or more processors 811, such as a micro-processor unit (MPU); a ROM 812 in which a program such as a boot up program is stored; a random access memory (RAM) 813 connected to the processors 811 and in which a command of an application program is temporarily stored and a temporary electronic storage area is provided; a hard disk 814 in which an application program, an operating system program, and data are stored; and a data communication bus 815 that connects the processors 811, the ROM 812, and the like. The computer 801 may include a network card (not shown) for providing a connection to a computer network such as a local area network (LAN), wide area network (WAN) or any other useful computer network for communicating data used by the computing system 800.

The program for causing the computer system 800 to execute the process for monitoring and/or controlling the EUV radiation source according to the embodiments disclosed herein are stored in an optical disk 821 or a magnetic disk 822, which are inserted into the optical disk drive 805 or the magnetic disk drive 807, and transmitted to the hard disk 814. Alternatively, the program may be transmitted via a network (not shown) to the computer system 800 and stored in the hard disk 814. At the time of execution, the program is loaded into the RAM 813. The program may be loaded from the optical disk 821 or the magnetic disk 822, or directly from a network. The stored programs do not necessarily have to include, for example, an operating system (OS) or a third-party program to cause the computer 801 to execute the methods disclosed herein. The program includes a command portion to call an appropriate function (module) in a controlled mode and obtain desired results in some embodiments.

According to an embodiment of the present disclosure, a system of monitoring and controlling tin contamination in the EUV light source includes a first temperature sensor inserted into a space surrounded by a plurality of vanes through a vane to obtain a first temperature in the space, a second temperature sensor embedded in the vane to detect a second temperature in the vane, a signal processor, and a process controller. The first temperature decreases as a function of tin contamination coating on an inserted portion of the first temperature sensor. The signal processor makes a comparison between the second and the first temperatures and determines an excess tin debris deposition based on a result of the comparison. The process controller activates a vane cleaning action upon being informed of the excess tin debris deposition by the signal processor. The system advantageously facilitates inline monitoring and controlling tin contamination in the EUV light source, thereby improving availability of the EUV light source tool and reducing risks of tin contamination on other tools like a reticle.

In accordance with an aspect of the present disclosure, a system of monitoring an EUV light source includes a first temperature sensor inserted into a space surrounded by a plurality of vanes through a vane of the plurality of vanes and configured to obtain a first temperature in the space; a second temperature sensor embedded in the vane and configured to detect a second temperature in the vane; and a signal processor. The first temperature decreases as a function of tin (Sn) contamination coating on an inserted portion of the first temperature sensor. The signal processor is configured to make a comparison between the second temperature and the first temperature and to determine an excess tin debris deposition based on a result of the comparison. In one or more of the foregoing and/or following embodiments, the signal processor is configured to determine the excess tin debris deposition upon detecting a difference between the second temperature and the first temperature is equal to or greater than a threshold temperature value. In one or more of the foregoing and/or following embodiments, the signal processor is configured to determine the excess tin debris deposition upon detecting a changing rate of a difference between the second temperature and the first temperature with time equal to or greater than a threshold changing rate. In one or more of the foregoing and/or following embodiments, the signal processor is configured to inform a process controller of the excess tin debris deposition upon determining the excess tin debris deposition.

In accordance with an aspect of the present disclosure, a system of monitoring and controlling an EUV light source includes: a first temperature sensor including a portion inserted into a space surrounded by a plurality of vanes through a vane of the plurality of vanes, wherein the first temperature sensor is configured to obtain an ambient temperature decreasing with time as a function of accumulated tin contamination coating on the inserted portion; a signal processor configured to determine an excess tin debris deposition on the vane based on the obtained chamber ambient temperature; and a process controller configured to activate a vane cleaning action upon being informed of the excess tin debris deposition by the signal processor. In one or more of the foregoing and/or following embodiments, the first temperature sensor includes a resistance temperature detector, a thermocouple sensor, or an infrared thermometer. In one or more of the foregoing and/or following embodiments, the signal processor is configured to determine the excess tin debris deposition on the vane upon observing the ambient temperature equal to or lower than a first threshold value. In one or more of the foregoing and/or following embodiments, the system further includes a second temperature sensor embedded in the vane and adjacent the first temperature sensor for detecting a vane temperature of the vane. In one or more of the foregoing and/or following embodiments, the second temperature sensor includes a resistance temperature detector or a thermocouple sensor. In one or more of the foregoing and/or following embodiments, the signal processor is configured to determine the excess tin debris deposition on the vane upon observing a difference between the vane temperature and the ambient temperature equal to or greater than a second threshold value. In one or more of the foregoing and/or following embodiments, the signal processor is configured to determine the excess tin debris deposition on the vane upon observing a changing rate of a difference between the vane temperature and the ambient temperature equal to or greater than a threshold value. In one or more of the foregoing and/or following embodiments, the chamber includes hydrogen gas ($H_2$). In one or more of the foregoing and/or following embodiments, a heater is attached to the vane and is activated to heat up the vane to remove the excess tin debris deposition upon the process controller being informed of the excess tin debris deposition. In one or more of the foregoing and/or following embodiments, the system further includes a heat insulator made of ceramic material for insulating other portions of the first temperature sensor than the inserted portion from the space and the vane.

In accordance with an aspect of the present disclosure, a method of monitoring an EUV light source, the method including: obtaining a first temperature in a space surrounded by a plurality of vanes by using a first temperature sensor, the first temperature sensor being inserted into the space through a vane of the plurality of vanes; detecting a second temperature in the vane by using a second temperature sensor embedded in the vane and adjacent the first temperature sensor; comparing the first and the second temperatures by using a signal processor to obtain a comparison result; and determining an excess tin debris deposition by the signal processor based on the comparison result. In one or more of the foregoing and/or following embodiments, the signal processor determines the excess tin debris deposition upon detecting a difference between the second temperature and the first temperature equal to or greater than a threshold temperature value. In one or more of the foregoing and/or following embodiments, the signal processor determines the excess tin debris deposition upon detecting a changing rate of a difference between the second temperature and the first temperature with time equal to or greater than a threshold changing rate. In one or more of the foregoing and/or following embodiments, the signal processor informs a process controller of the excess tin debris deposition upon determining the excess tin debris deposition. In one or more of the foregoing and/or following embodiments, the process controller activates a cleaning action upon being informed of the excess tin debris deposition, and the cleaning action includes heating up a heater attached to the vane to remove the excess tin debris deposition from the vane.

It will be understood that not all advantages have been necessarily discussed herein, no particular advantage is required for all embodiments or examples, and other embodiments or examples may offer different advantages.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system of an EUV light source, the system comprising:
   a first temperature sensor inserted into a space surrounded by a plurality of vanes through a vane of the plurality of vanes and configured to obtain a first temperature in the space, wherein the first temperature decreases as a function of tin (Sn) contamination coating on an inserted portion of the first temperature sensor; and
   a second temperature sensor embedded in the vane and configured to detect a second temperature in the vane; and
   a signal processor configured to make a comparison between the second temperature and the first temperature and to determine an excess tin debris deposition based on a result of the comparison.

2. The system of claim 1, wherein the signal processor is configured to determine the excess tin debris deposition upon detecting a difference between the second temperature and the first temperature equal to or greater than a first threshold temperature value.

3. The system of claim 1, wherein the signal processor is configured to determine the excess tin debris deposition upon detecting a changing rate of a difference between the second temperature and the first temperature with time equal to or less than a threshold changing rate.

4. The system of claim 1, wherein the signal processor is configured to inform a process controller of the excess tin debris deposition upon determining the excess tin debris deposition.

5. A system of an EUV light source, the system comprising:
   a first temperature sensor comprising a portion inserted into a space surrounded by a plurality of vanes through a vane of the plurality of vanes, wherein the first temperature sensor is configured to obtain an ambient temperature decreasing with time as a function of accumulated tin (Sn) contamination coating on the inserted portion;
   a signal processor configured to determine an excess tin debris deposition on the vane based on the obtained chamber ambient temperature; and
   a process controller configured to activate a vane cleaning action upon being informed of the excess tin debris deposition by the signal processor.

6. The system of claim 5, wherein the first temperature sensor comprises a resistance temperature detector (RTD), a thermocouple sensor, or an infrared thermometer.

7. The system of claim 5, wherein the signal processor is configured to determine the excess tin debris deposition on the vane upon observing the ambient temperature equal to or lower than a first threshold value.

8. The system of claim 5, further comprising a second temperature sensor embedded in the vane and adjacent the first temperature sensor for detecting a vane temperature of the vane.

9. The system of claim 8, wherein the second temperature sensor comprises a resistance temperature detector (RTD) or a thermocouple sensor.

10. The system of claim 8, wherein the signal processor is configured to determine the excess tin debris deposition on the vane upon observing a difference between the vane temperature and the ambient temperature equal to or greater than a second threshold value.

11. The system of claim 8, wherein the signal processor is configured to determine the excess tin debris deposition on the vane upon observing a changing rate of a difference between the vane temperature and the ambient temperature equal to or less than a threshold rate value.

12. The system of claim 11, further comprising:
   a heat insulator insulating other portions than the inserted portion of the first temperature sensor from the space and the vane; and
   a heater attached to the vane and configured to heat up to remove the excess tin debris deposition formed on the vane.

13. The system of claim 5, wherein the process controller is configured to direct an EUV light to expose a wafer upon determining no excess tin debris deposition on the vane.

14. The system of claim 13, wherein a heater is attached to the vane, and wherein the process controller activates the heater to heat up the vane to a heated up temperature to remove the excess tin debris deposition from the vane upon being informed of the excess tin debris deposition by the signal processor.

15. The system of claim 5, further comprising a heat insulator made of ceramic material for insulating other portions of the first temperature sensor than the inserted portion from the space and the vane.

16. A method of monitoring an EUV light source, the method comprising:
   obtaining a first temperature in a space surrounded by a plurality of vanes by using a first temperature sensor, the first temperature sensor being inserted into the space through a vane of the plurality of vanes;
   detecting a second temperature in the vane by using a second temperature sensor embedded in the vane and adjacent the first temperature sensor;
   comparing the first and the second temperatures by using a signal processor to obtain a comparison result; and
   determining an excess tin debris deposition by the signal processor based on the comparison result.

17. The method of claim 16, wherein the signal processor determines the excess tin debris deposition upon detecting a difference between the second temperature and the first temperature equal to or greater than a threshold temperature value.

18. The method of claim 16, wherein the signal processor determines the excess tin debris deposition upon detecting a changing rate of a difference between the second temperature and the first temperature with time equal to or less than a threshold changing rate.

19. The method of claim 16, wherein the signal processor informs a process controller of the excess tin debris deposition upon determining the excess tin debris deposition.

20. The method of claim 19, wherein the process controller activates a cleaning action upon being informed of the excess tin debris deposition, and wherein the cleaning action comprises heating up a heater attached to the vane to a heated up temperature to remove the excess tin debris deposition from the vane.

* * * * *